(12) United States Patent (10) Patent No.: US 7,397,959 B1
Volkoff et al. (45) Date of Patent: Jul. 8, 2008

(54) DETECTION AND RECOMPRESSION OF EMBEDDED COMPRESSED DATA INSIDE EXISTING DATA STREAMS

(75) Inventors: Serge Volkoff, San Bruno, CA (US); Michael Paul Halpin, Soquel, CA (US); Darryl Lovato, Royal Oaks, CA (US)

(73) Assignee: Smith Micro Software, Inc., Aliso Viejo, CA (US)

( * ) Notice: Subject to any disclaimer, the term of this patent is extended or adjusted under 35 U.S.C. 154(b) by 0 days.

(21) Appl. No.: 11/679,818

(22) Filed: Feb. 27, 2007

Related U.S. Application Data

(63) Continuation of application No. 11/029,437, filed on Jan. 4, 2005, now Pat. No. 7,184,603, and a continuation of application No. 11/029,438, filed on Jan. 4, 2005.

(51) Int. Cl.
*G06K 9/36* (2006.01)

(52) U.S. Cl. .................... 382/233; 382/232; 382/240; 382/209

(58) Field of Classification Search ............. 382/232, 382/233, 240, 209, 218, 219; 700/1, 95; 702/182; 718/101
See application file for complete search history.

(56) References Cited

U.S. PATENT DOCUMENTS

| | | | | |
|---|---|---|---|---|
| 4,215,406 A | * | 7/1980 | Gomola et al. | 700/95 |
| 4,215,407 A | * | 7/1980 | Gomola et al. | 700/95 |
| 4,216,528 A | * | 8/1980 | Robertson | 700/95 |
| 4,227,245 A | * | 10/1980 | Edblad et al. | 700/95 |
| 4,389,706 A | * | 6/1983 | Gomola et al. | 700/1 |
| 5,408,542 A | | 4/1995 | Callahan | 128/889 |
| 5,708,511 A | | 1/1998 | Gandhi et al. | 382/239 |
| 6,731,814 B2 | | 5/2004 | Zeck et al. | 715/848 |

* cited by examiner

*Primary Examiner*—Anh Hong Do
(74) *Attorney, Agent, or Firm*—Craig M. Stainbrook; Stainbrook & Stainbrook, LLP

(57) ABSTRACT

A system and method for the detection, compression, and decompression of previously compressed data that resides in data or files of an unknown data or file format.

1 Claim, 3 Drawing Sheets

Decompression Process

DETECTION AND RECOMPRESSION OF EMBEDDED COMPRESSED DATA INSIDE EXISTING DATA STREAMS

CROSS REFERENCE TO RELATED APPLICATIONS

The present application claims the benefit of the filing date of U.S. patent application Ser. No. 11/029,438, filed Jan. 4, 2005, entitled, "System and Method for Lossless Compression of Already Compressed Files," which claims the benefit of U.S. Provisional Patent Application Ser. No. 60/628,377, filed Nov. 15, 2004, bearing the title, "Compressor of Already Compressed Files"; as well as U.S. patent application Ser. No. 11/029,437, filed Jan. 4, 2005, entitled "System and Method for Lossless Compression of Digital Images," which in turn claims the benefit of U.S. Provisional Patent Application Ser. No. 60/628,376, filed Nov. 15, 2004, bearing the title, "Improvements to Lossless Image Compression."

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to data compression and decompression, file archiving, and streaming compression. Specifically, the present invention relates to a system and method for the detection and subsequent compression and decompression of files and data that include embedded data and files that have previously been compressed, and in particular, to the detection and compression of previously compressed data that resides in data or files of an unknown data or file format.

2. Discussion of Related Art Including Information Disclosed Under 37 CFR § 1.97, 1.98

The use of data compression or encoding schemes to reduce the size of files for backup or file transmission is well known in the art. Many types of data and files are compressed, including images in the well known GIF, TIFF, PNG, and JPEG formats (though including many others), video in the MPEG format, sound in MP3 and other formats, as well as standard archive formats, such as SIT, ZIP, GZIP, and so forth. Furthermore, many types of files have compressed images embedded inside, e.g., PDF files, WORD documents, and the like. Further, many of these compressed data types are included inside proprietary or unknown file formats.

Files and data streams that have been compressed, or include compressed data using sub-optimal techniques now comprise a major part of existing data, both for storage and transmission. (As used herein "file" and "data stream" are used interchangeably to denominate an identified set of data elements which may exist in several forms, including in a discrete form, or combined or stored with other files, or embedded in another file as a file or as an object, or as a file containing other files, or as a data stream of determinate or indeterminate size, including information transmitted over a data channel.) Compressed data is frequently large, and despite considerable advances in mass-storage density, computer processor speeds, and telecommunication system performance, compression techniques do not yet satisfactorily solve the space and transmission bandwidth problems. Developers of compression technology are now hard pressed to keep pace with the rapid growth of multimedia web-based applications which utilize enormous amounts of data. It would be advantageous, therefore, to compress files that include already compressed files even further. Moreover, it is desirable that such further compression be lossless—pixels, sound data, and the like remain the same—with no loss in quality over the original.

It is generally considered "impossible" to meaningfully compress already compressed data. More accurately, perhaps, it should be said that it is considered impractical to compress already compressed data, though it is true that most attempts at compression of already compressed files using currently known methods fail altogether and actually result in an increase in file size. Attempts have been made to compress JPEG, GIF, PNG files, and the like, but current compression algorithms when applied to these types of files generally achieve only a 1-2% improvement.

Further, JPEG, GIF, PNG and other types of images and other types of compressed data are commonly included/incorporated as portions of many other types of files and data. Many of these files and data streams that incorporate compressed data types are proprietary or otherwise unknown.

Accordingly, the present invention provides a data compression system and method that detects and categorizes embedded data types within unknown or partially known data streams. Each of these then categorized data streams (such as embedded GIF, TXT, HTML, PNG, JPEG, among others) can be processed separately with an appropriate compression method—such as those described in U.S. patent application Ser. No. 11/029,437, which relates to the compression of image data and which is incorporated in its entirety by reference herein, and also in U.S. patent application Ser. No. 11/029,438, which relates to further compression of already compressed data, and which is also incorporated in its entirety by reference herein. It must be emphasized that while PNG, GIF and others are themselves is a lossless, and JPEG is a lossy compression technology, the present inventive method of detecting and processing these files is lossless in that the original pixel or other underlying information is not compromised or reduced in any way.

In the case of compressed data which was originally lossy (where data loss was created in the original data compression, such as in JPEG/MP3, etc), which are embedded inside other data/file formats, no data loss is created in addition to the loss originally incurred/created by JPEG/MP3, or other compression protocol, when employing the present invention.

Further, the present invention provides a means to compress a wide range of unknown/unspecified data types/files in which already compressed files reside. This works by detecting and breaking a file down into its core data types, identifying and organizing the core data types, selecting an optimal compressor for the particular types, and then compressing the types in separate data streams.

The foregoing discussion reflects the current state of the art of which the present inventors are aware. Reference to, and discussion of, this art is intended to aid in discharging Applicants' acknowledged duties of candor in disclosing information that may be relevant to the examination of claims to the present invention.

BRIEF SUMMARY OF THE INVENTION

The present invention is a system and method of compressing files and data that include already compressed files and data (in inner formats). The system and method, when applied to an unknown or partially known outer data stream or file format, employs three principal processes—encoding, decoding, and updating references—all of which include a number of method steps. These are set out in detail in the detailed description of the preferred embodiments, set forth below, as well as illustrated in the drawings.

In the case of compressing unknown files, it should be noted that the way that the present invention detects and subsequently groups and compresses embedded compressed data is is novel and unrelated in principle to the way in which standard compressors such as ZIP®, WINZIP®, and current versions of STUFFIT®, among other generic data compression products compress data, and achieves significantly better results. [ZIP® is a registered trademark of Iomega Corporation of Roy Utah; WINZIP® is a registered trademark of WinZip International, LLC, of Mansfield, Conn.; and STUFFITT® is a registered trademark of Smith Micro Software, Inc., of Aliso Viejo, Calif.]

It is therefore an object of the present invention to provide a new and improved system and method for lossless compression of data and files which include already compressed digital files and data.

It is another object of the present invention to provide a new and improved method of detecting files embedded inside an existing data stream or file.

It is another object of the present invention to provide a new and improved method of locating and preserving size references to detected compressed data inside in an unknown data stream or file.

Yet another principal object of the present invention is to provide a method to update detected size references of compressed data in partially known or unknown data streams, in those cases in which an existing data stream size changes during compression and decompression.

Yet another object of the present invention is to provide a method to improve compression of already compressed files, embedded in other data or files by using multiple compression techniques, and selecting a technique or techniques optimized for each respective compressed unit of the file.

Another object of the present invention is to provide a method to improve the compression of already compressed files by breaking heterogeneous data into homogeneous blocks and compressing each homogenous block as a separate data stream with a compressor superior to the one originally employed.

Yet another object of the present invention is to provide a method to compress audio, video, and image files that were compressed and embedded in any type of data stream or file by a combination of lossy techniques followed by decompressing the lossless part and replacing the employed lossless technique with a superior lossless technique.

Yet another object of the present invention is to acquire information about the compressed data, including, but not limited to, the original compression method, and original compressed size, and about the structure of the outer format, and to encode such information, as needed into the recompressed file. This data will be used when restoring the original document to insure that the result is functionally identical to the original with respect to software applications normally used to access it.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of the claims appended hereto.

Accordingly, before explaining the preferred embodiment of the disclosure in detail, it is to be understood that the disclosure is not limited in its application to the details of the system construction and the arrangements set forth in the following description or illustrated in the drawings. The inventive method described herein is capable of other functionally equivalent embodiments and of being practiced and carried out in various ways.

As such, those skilled in the art will appreciate that the conception, upon which this disclosure is based may readily be used as a basis for designing other methods and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and method steps that characterize the invention, are pointed out with particularity in the claims annexed to and forming a part of this disclosure. For a better understanding of the present invention, its advantages and the specific objects attained by its uses, reference should be made to the accompanying drawings and descriptive matter in which there are illustrated the preferred embodiment.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Definitions: As used herein, the term "file" means a named set of data element stored in machine readable form, which may exist in several forms, including in a discrete form, or combined or stored with other files, or embedded in another file as a file or as an object, or as a file containing other files, or as a data stream of a determinate size, including information transmitted over a data channel.

Figure 1:
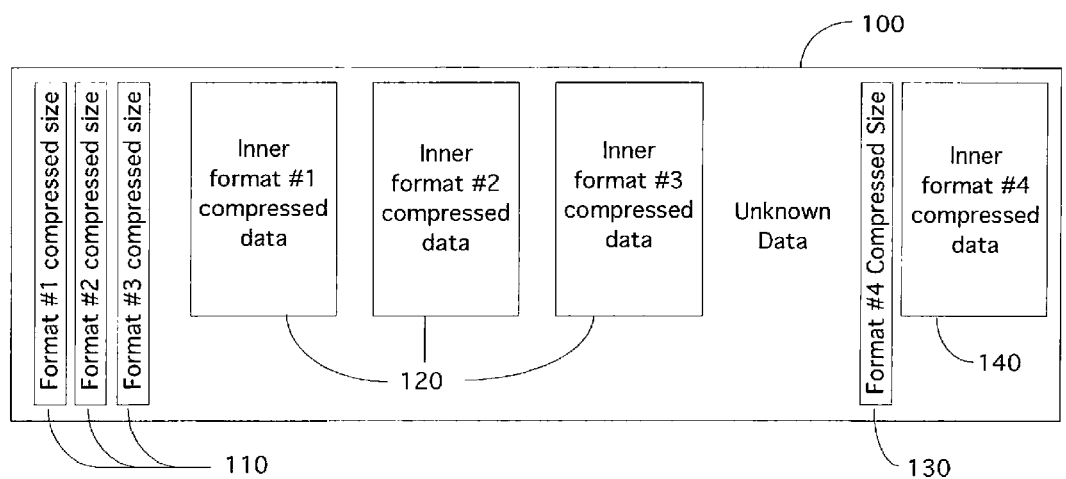
FIG. 1 illustrates the general structure of the outer format containing compressed data in inner formats, and size references to compressed data.
Figure 2:
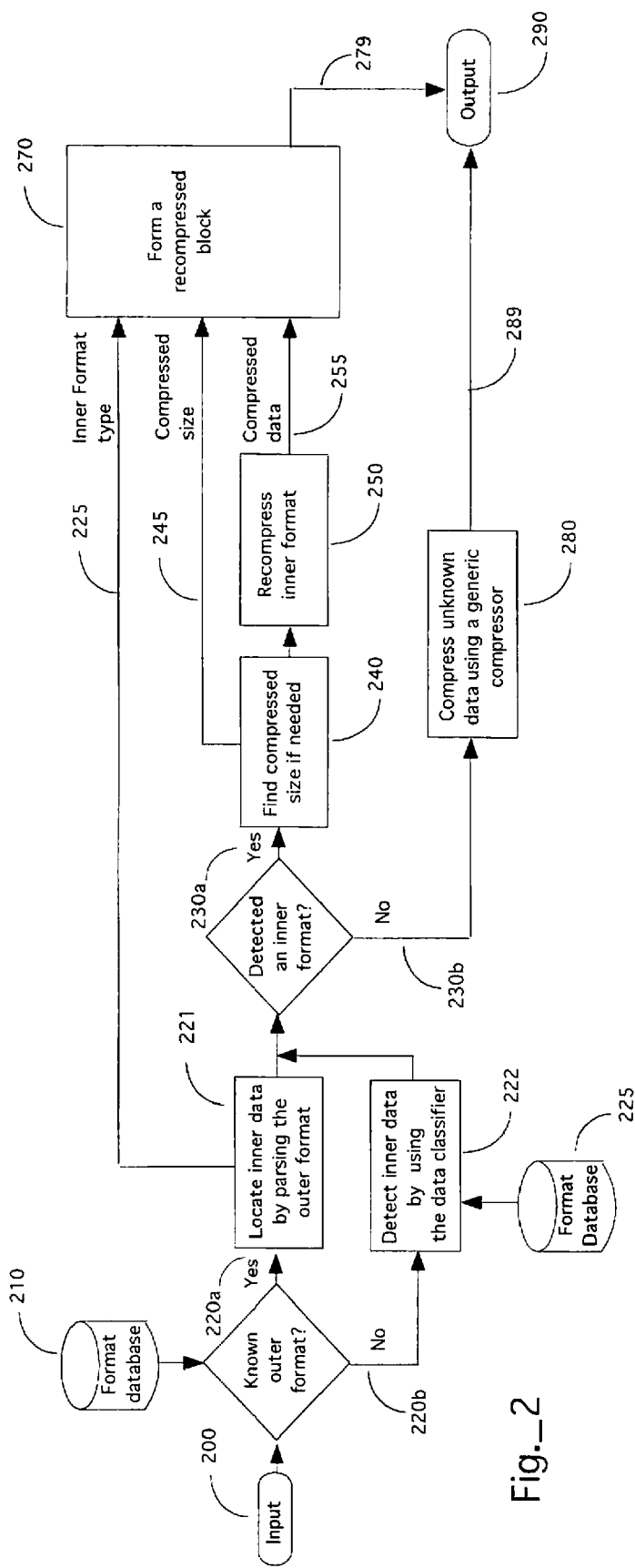
FIG. 2 is a schematic flow diagram illustrating the general functional elements of the compressor of files which contain already compressed files or data of the present invention.
Figure 3:
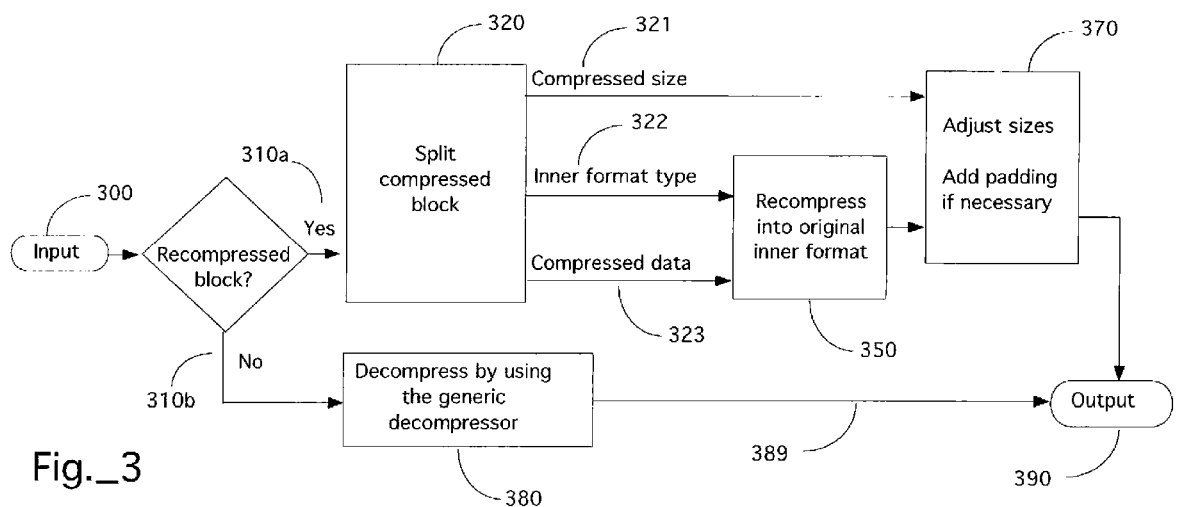
FIG. 3 is a schematic flow diagram illustrating the general functional elements of the decompressor of files which contain already compressed files or data of the present invention.

Referring to FIGS. 1 through 3, there is illustrated therein a new and improved system and method for compression of files and data streams which include already compressed files.

Referring now to FIG. 1, 100 represents a data stream or file in the outer format that includes already compressed data streams or files 120, 140, stored in inner formats, and size references 110, 130 that correspond to compressed sizes of inner data streams or files.

Referring next to FIG. 2, 200 represents the input data stream or file being consumed by the compression process. Input data 200, in combination with the format database 210 is used to determine the type of the outer format being processed. If the outer format is determined to be a known, parseable format (220a) the input data stream or file is parsed and individual inner file types are located in step 221. Otherwise, when the outer format is not fully known and therefore not parseable, inner file types are detected by examining input using the data classifier 222 and the format database 225. If inner data in a known format is not located (230b), subsequent data is considered "unformatted" until a point where an inner format is detected again later in the input data stream or file, or the outer data stream or file ends. "Unformatted" data is passed to a generic compressor 280 for possible size reduction. If inner data in a known format is located (230a), a compressed block is formed, as follows. Compressed size references, if any, are located and extracted in step 240. Inner data is decompressed and recompressed by an optimized algorithm 250, producing recompressed data 255. Recompressed data 255 is combined with the inner format type 225 and compressed size reference or references 245, if any, to form a recompressed block in step 270. Recompressed data 279 and generically compressed data 289 are then interleaved to form the output 290.

Referring next to FIG. 3, 300 represents the recompressed data stream or file in the outer format being consumed as the input of the decompression process. Recompressed data is a series of blocks formed by the compressor. If a recompressed block is encountered (310a), it is split in step 320 into its component parts, compressed size 321, inner format type 322 and compressed data 323. Compressed data 323 is decompressed from its optimized form and recompressed to reconstitute the original inner format 322. Compressed size reference or references 321, if any, are used in step 370 to adjust sizes and introduce padding, if necessary, into the outer data stream or file being recreated. The output of this process is designated by 379 and is one of the two components of the output. "Unformatted" data encountered in 310b, decompressed by the generic decompressor 380, forms the other part of the output, designated by 389. The two parts, 379 and 389, are combined to reconstruct the entire original data stream or file 390.

Accordingly, in a first preferred embodiment, when applied to an unknown or partially known data stream or file format, the method to compress already compressed files of the present invention employs three principal processes, including encoding, decoding, and adjusting the references, and each principal process involves a number of method steps. To begin with, then:

(A) First, the encoding step includes the following:

(1) Determining the type of data being compressed, if possible, (a) by File Name Extension (.xyz); or (b) by File header information (first few bytes).

(2) If the inner file type is found in step (1), and it is of a fully known data type, simply process it with the standard method for that file type and the process ends—i.e. the input file is a known JPEG, GIF, etc document. Further, even though some outer formats, such as PDF, have complete specifications available, it is not necessary to fully parse these formats to find inner compressed content, such as JPEG images.

(3) If the outer format is not a fully parseable or fully known format, step (2) is insufficient. In this case, look up file type in the database to determine what possible inner data types could be embedded in the outer format. For example, an installer payload file may include a ZIP file (the files to be installed), and perhaps GIF images (startup screens, etc). Further, it may be possible to find fixed locations of certain types of data in some outer formats, and this look up-step would greatly speed up the scan of the document in the next step.

(4) Scan the document on a byte by byte basis, at each step: (a) Examine the next N bytes and compare them against the header format for either possible inner formats, if the file type was in the database of semi-known files given in step (2) or, alternatively, if the file type was not known, compare the next N bytes against all data types for which recompression algorithms are available in the overall system—including, but not limited to JPEG, GIF, TEXT, ZIP, MP3, etc. (For ease of reference, this step will be called the data classifier.) (b) If there is no match by the data classifier, the current byte is input to the regular compression method, and processing continues, until all bytes have been processed. (c) If there is a match, meaning that at some position in the outer file, the data classifier has detected a known inner data type, that entire now known sequence of data is input into the appropriate specialized recompressor, and control information (token) needed for the decompression step is inserted into the recompressed stream. Processing continues at the end of the data of the known type. For example, when scanning an unknown data stream, if a JPEG image is detected by the data classifier at byte X, the entire JPEG data stream of size Y is sent to the JPEG recompressor, and the process continues at byte X+Y, enabling a multitude of inner data types to be detected and similarly processed, in a single data stream or file.

(5) When restoring the original document, recompressed blocks will be decompressed by the specialized compressor which made them, and the original compression method will be reapplied to the resulting raw data.

(a) The "round trip" process consisting of recompression and subsequent decompression of inner data formats may create differently sized outputs. Even though the raw compressed data stored in compressed form is the same, compressed representation of it may not be, as the system involves a sequence of development processes and decisions before it enables such non-lossless reconstitution of the inner format within a particular known outer format. The system must be able to identify the outer format as of a particular class, and identify and acquire existing software which is capable of reading and utilizing content in the outer format. Accordingly, it employs such software to verify the results of any round trip recompression of inner formats performed, and through research, or experimentation design code which locates and adjusts any sizes or offsets which are affected by the recompression of the inner content. The non-lossless recompression of an inner format is limited to being triggered at runtime to scenarios which have been proven viable through such prior research.

The reference adjustment step includes a runtime process of scanning backward from the start of the embedded content looking for some common numerical representation of the known compressed size of the content. Such a search might include (but is not limited to), searching for big-endian and little-endian 16, 32, and 64 bit binary representations of compressed sizes or references, as well as ASCII representations of the numerals in octal, decimal, or hexadecimal forms. This runtime process of scanning backward is done on outer formats (recognized by file name extension or some other signature) which have previously been identified as formats where this approach is necessary and sufficient. It has been determined that for some specifically identified outer formats, it is necessary but insufficient to do non-lossless recompression of inner content, in which event the choice is not to do such non-lossless recompression.

As part of the backward scanning process design, the inventive system stores metadata about the original compressed size of the recompressed data in order to support these operations, or, in some cases to determine that no change in compressed size has occurred.

No scanning and updating of references will be required if it is possible to force the restored compressed data to match the size of the original, even though it may not be identical. For example, a method which stores both the compressed size (C) and original size (O) of its content, and whose decompression algorithm always consumes exactly C bytes, and produces exactly O bytes, theoretically could be forced to emit less than the C bytes, and then be artificially padded to the size C. If such a format exists or subsequently comes into existence, the present invention provides a technique that will force the un-recompressed data to appear to be of an unchanged size, while remaining lossless with respect to the original content.

Where truly lossless recompression is achieved (for example, in recompression of BWT compressed data), no such development time research or runtime scanning will be required.

(B) The second principal step in the inventive system is decoding, which starts at the beginning of the compressed data stream and continues to the end of the compressed data stream, and includes the following method steps: (1) If the next token identifies an inner compressed data stream, send the compressed data stream to the specialized compressor that created it—so that it can output the decompressed data into the decompressed data stream, then continue with the next token. (2) Otherwise, the next token is raw data that is output to the decompressed data stream. (3) Continue with the next token until the end of the outer compressed stream is reached.

(C) If required, updating of references to compressed sizes and offsets will likely be most efficient when interleaved with the restoration of each compressed block, though it may also be applied as a post process to the entire restored document.

In compound outer file types containing multiple inner data types, the inventive method uses multiple recompression techniques and adapts to each compressed unit by selecting a recompression technique optimized for the respective type of data. Compression techniques which are optimized to specific types of data achieve better compression ratios (for that particular type of data) than generic techniques or techniques optimized for a different type of data. In the present invention, the encoder analyzes the data and chooses techniques optimized for each type of data, if such techniques are available. The compression technique which was used is encoded in the output stream. The decoder reads from the input stream the type of compression technique which was used to compress the data. It then applies the suitable decompressor.

Accordingly, it will be appreciated that the method of the present invention is a type-adaptive compression system.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

SEQUENCE LISTING

Not applicable.

What is claimed as invention is:

1. A method for detecting, compressing, and decompressing previously compressed data that resides in data or files of an unknown or partially known data stream or file format, said method comprising the steps of:
   (a) determining a type of data to be compressed;
   (b) when outer file formats are known, processing the known file types with standard methods known for that file type;
   (c) when outer file formats are not known, searching a database to determine what data types could be embedded in the outer format;
   (d) scanning a document byte-by-byte and either comparing next N bytes against a header format for possible inner formats for partially known files, or comparing the next N bytes against all data types for unknown file types for available recompression algorithms;
   (e) when matches are found, recompressing the now known sequence of data using a specialized recompressor;
   (f) acquiring information about the compressed data, including at least the original compression method, original compressed size, and structure of the outer format, and encoding such information into the recompressed file;
   (g) decoding the compressed data stream; and
   (h) adjusting and updating reference to compressed sizes and offsets.

* * * * *